(12) United States Patent
Watanabe

(10) Patent No.: US 12,500,524 B2
(45) Date of Patent: Dec. 16, 2025

(54) POWER SUPPLY DEVICE

(71) Applicant: YAZAKI CORPORATION, Tokyo (JP)

(72) Inventor: Tsunehiro Watanabe, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 230 days.

(21) Appl. No.: 18/456,464

(22) Filed: Aug. 25, 2023

(65) Prior Publication Data

US 2023/0402938 A1    Dec. 14, 2023

Related U.S. Application Data

(63) Continuation of application No. PCT/JP2022/038488, filed on Oct. 14, 2022.

(30) Foreign Application Priority Data

Nov. 15, 2021    (JP) .................. 2021-185738

(51) Int. Cl.
*H02M 7/00* (2006.01)
*H05K 7/14* (2006.01)
*H05K 7/20* (2006.01)

(52) U.S. Cl.
CPC .......... *H02M 7/003* (2013.01); *H05K 7/1432* (2013.01); *H05K 7/20409* (2013.01); *H05K 7/209* (2013.01)

(58) Field of Classification Search
CPC . H02M 7/003; H05K 7/1432; H05K 7/20409; H05K 7/209
USPC .......................................... 361/714
See application file for complete search history.

(56) References Cited

U.S. PATENT DOCUMENTS

| | | | |
|---|---|---|---|
| 2019/0090368 A1* | 3/2019 | Hashii | H05K 5/069 |
| 2019/0334375 A1 | 10/2019 | Wataru et al. | |
| 2019/0348263 A1* | 11/2019 | Okunishi | H01F 27/02 |
| 2021/0315115 A1* | 10/2021 | Zhang | G06T 1/20 |
| 2021/0368618 A1* | 11/2021 | Ikeda | H05K 7/20409 |

FOREIGN PATENT DOCUMENTS

| | | | | |
|---|---|---|---|---|
| CN | 100468716 C | * | 3/2009 | ........... H01L 23/552 |
| CN | 106340493 B | * | 2/2020 | ............. H01L 24/72 |
| CN | 113053622 A | * | 6/2021 | ......... H01F 17/0013 |
| JP | 2019-193517 A | | 10/2019 | |

* cited by examiner

*Primary Examiner* — Mandeep S Buttar
*Assistant Examiner* — Kyle Oxenknecht
(74) *Attorney, Agent, or Firm* — KENEALY VAIDYA LLP

(57) ABSTRACT

A power supply device include an electronic component unit, and a conductive housing for accommodating the electronic component unit. The housing includes a columnar part extending from a surface of an outer wall of the housing, and a circulating part connected to the columnar part and extending away from the columnar part while circulating in a spiral circulation form. The housing is electrically connected to a ground circuit of the electronic component unit inside the housing.

5 Claims, 3 Drawing Sheets

POWER SUPPLY DEVICE

CROSS-REFERENCE TO RELATED APPLICATIONS

This is a continuation of International Application No. PCT/JP2022/038488 filed on Oct. 14, 2022, and claims priority from Japanese Patent Application No. 2021-185738 filed on Nov. 15, 2021, the entire content of which is incorporated herein by reference.

TECHNICAL FIELD

The present invention relates to a power supply device that includes an electronic component unit and a conductive housing for accommodating the electronic component unit.

BACKGROUND ART

In the related art, a DC/DC converter is used for a purpose of, for example, electric power conversion between a battery mounted on a vehicle such as a hybrid vehicle and an inverter (see, for example, Patent Literature 1). The DC/DC converter generally has a structure in which an electronic component unit for performing the electric power conversion is accommodated in a metal housing.

CITATION LIST

Patent Literature

Patent Literature 1: JP2019-193517A

SUMMARY OF INVENTION

However, in general, at energization to an electronic component or the like, a phenomenon occurs that a part of a current, which should originally stay in a circuit being energized, leaks to a ground (GND) via stray capacitances inevitably present inside and outside the circuit or the like, and the leaked current (a so-called noise current) circulates into the circuit again via other stray capacitances or the like. Noise caused by such a noise current is called common mode noise. In particular, it is known that when switching control at a large current and a high frequency is performed by the electronic component unit, an influence caused by the common mode noise increases as in a switching type DC/DC converter. Therefore, in order to be capable of reducing the influence caused by the common mode noise on an operation of the DC/DC converter, and appropriately exhibiting an original function of the DC/DC converter, a countermeasure against the common mode noise is required. As understood from the description described above, it is preferable that the common mode noise is reduced not only in the DC/DC converter but also in other power supply devices.

An object of the invention is to provide a power supply device capable of reducing common mode noise.

According to one aspect of the invention, a power supply device includes an electronic component unit, and a conductive housing for accommodating the electronic component unit. The housing includes a columnar part extending from a surface of an outer wall of the housing, and a circulating part connected to the columnar part and extending away from the columnar part while circulating in a spiral circulation form. The housing is electrically connected to a ground circuit of the electronic component unit inside the housing.

DESCRIPTION OF EMBODIMENTS

Hereinafter, a power supply device 1 according to an embodiment of the invention will be described with reference to the drawings. Typically, the power supply device 1 is mounted on a vehicle such as a hybrid vehicle and is used. The power supply device 1 includes a switching type DC/DC converter, and has a voltage conversion function of converting an input voltage (for example, 240V) from a driving battery (a lithium ion battery or the like) for driving a vehicle driving motor mounted on a vehicle to a voltage (for example, 12V) of a battery for driving an on-vehicle electric component mounted on the vehicle, and outputting the voltage.

Figure 1:
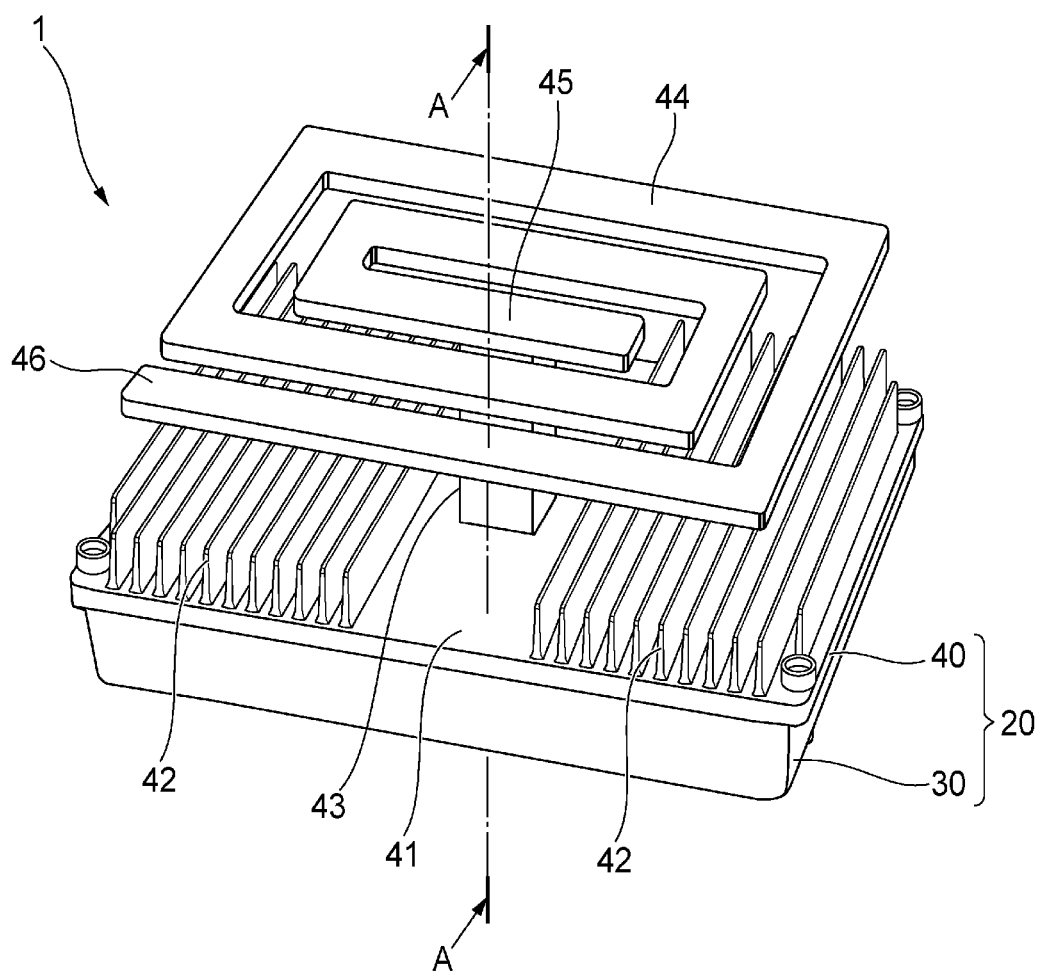
FIG. 1 is a perspective view illustrating a power supply device according to an embodiment of the invention in a vertically inverted manner.
Figure 1:
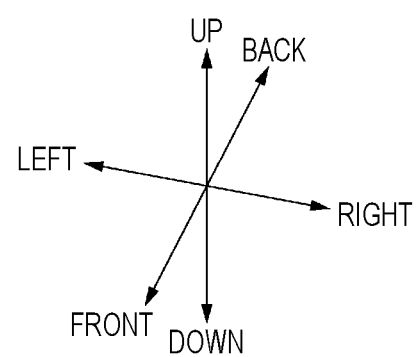
Figure 2:
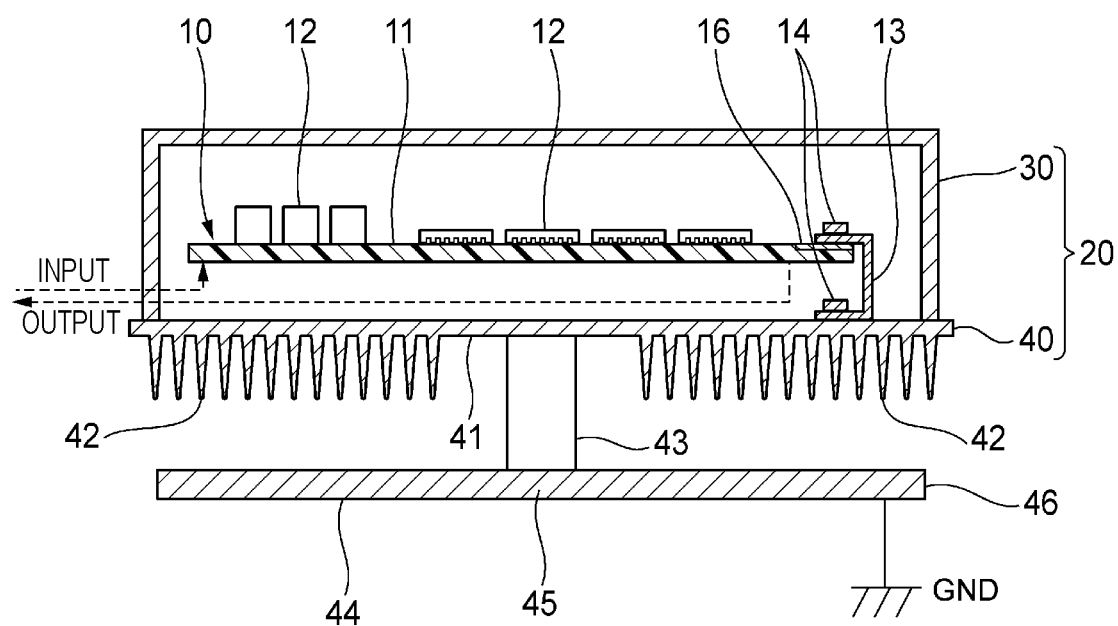
FIG. 2 is a diagram illustrating a cross section taken along a line A-A in FIG. 1 of the power supply device according to the embodiment of the invention.
Figure 2:
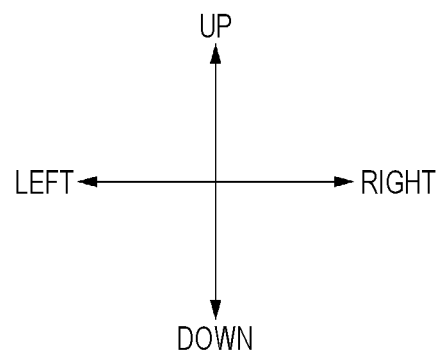
Figure 3:
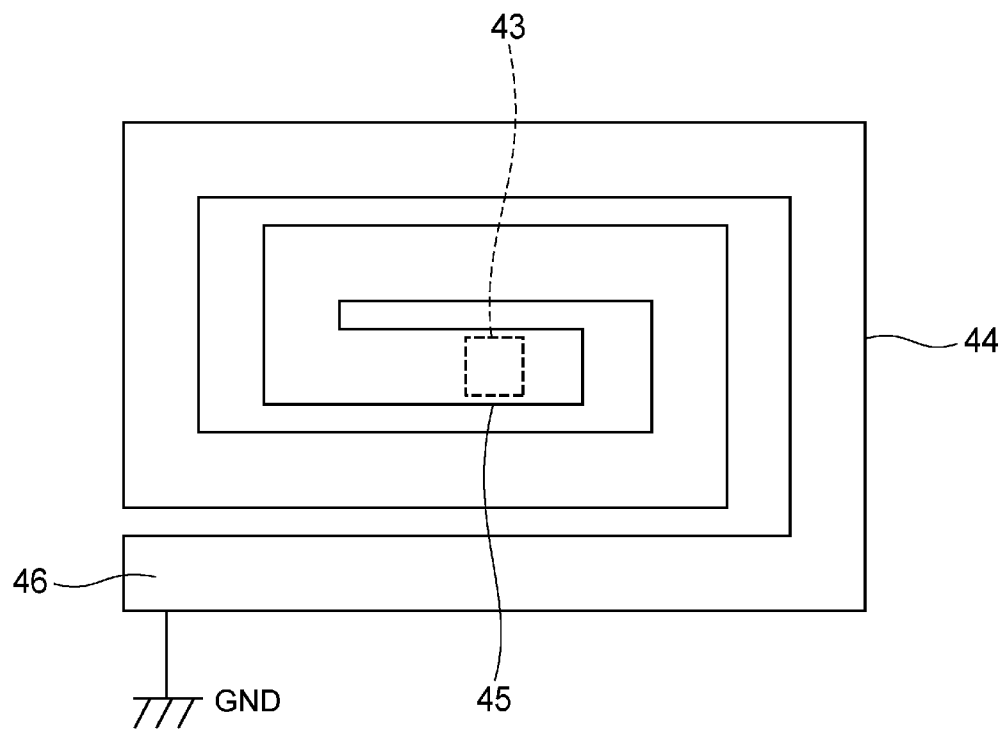
FIG. 3 is a bottom view of only a circulating part in FIG. 1.
Figure 3:
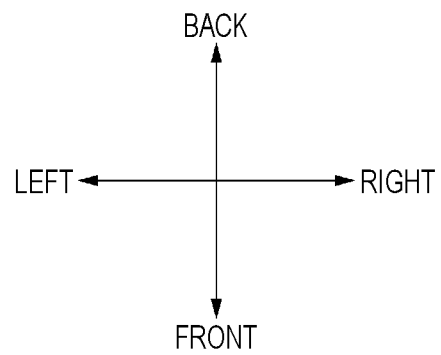

Hereinafter, for convenience of description, as illustrated in FIGS. 1 to 3, a "front-back direction", an "up-down direction", and a "left-right direction" are defined. The "front-back direction", the "up-down direction", and the "left-right direction" are orthogonal to one another. The up-down direction matches with, for example, an up-down direction of the vehicle on which the power supply device 1 is mounted. However, depending on a layout of the power supply device 1 in the vehicle or the like, the up-down direction may not match with the up-down direction of the vehicle.

As illustrated in FIGS. 1 and 2, the power supply device 1 includes an electronic component unit 10 (see FIG. 2) and a metal housing 20 (see FIGS. 1 and 2) that accommodates the electronic component unit 10. The electronic component unit 10 is the switching type DC/DC converter that achieves the electric power conversion function described above, and includes a rectangular flat plate-shaped circuit substrate 11 and a plurality of kinds of electronic components 12 mounted on an upper face of the circuit substrate 11. For example, by using the electronic components 12, a power circuit for voltage conversion including a switching transistor, a transformer, a rectifier diode, a smoothing circuit, and the like, and a control circuit for controlling the power circuit are constituted.

Since the electronic component unit 10 is the switching type DC/DC converter, switching at a large current and a high frequency is performed in the electronic component unit 10 during operation of the electronic component unit 10. Therefore, in the electronic component unit 10, an influence caused by common mode noise at a high frequency increases. Further, the electronic components 12 mounted on the circuit substrate 11 generate heat during the operation of the electronic component unit 10, so that the heat is generated from the electronic component unit 10 (in particular, the electronic components 12 constituting the power circuit).

In the present embodiment, the housing 20 includes an upper cover member 30 and a lower plate member 40, and each of the upper cover member 30 and the lower plate member is an aluminum die cast product. The upper cover member 30 has a substantially rectangular parallelepiped box shape that has an opening downward. The lower plate member includes a lower plate body 41 that has a substantially rectangular flat plate shape.

As illustrated in FIG. 2, the electronic component unit 10 is accommodated in the upper cover member 30 such that the electronic component unit 10 is fixed in a predetermined posture and at a predetermined position. The lower plate member 40 (the lower plate body 41) is attached to a lower edge portion of the upper cover member 30 such that the lower plate member 40 closes a lower end opening of the upper cover member 30 in which the electronic component unit 10 is accommodated. When the lower plate member 40 (the lower plate body 41) is attached to the upper cover member 30, a ground contact 16 connected to a ground (GND) circuit of the electronic component unit 10 (the circuit substrate 11), and an upper face of the lower plate body 41 are electrically conducted and connected to each other by using a metal bus bar 13 and a pair of metal bolts 14. Therefore, as illustrated in FIG. 2, the housing (=the upper cover member 30+ the lower plate member 40) is electrically connected to the ground circuit of the electronic component unit 10 inside the housing 20.

As illustrated in FIGS. 1 and 2, the lower plate member 40 integrally includes a plurality of heat dissipating fins 42 extending downward from an outer surface (a lower face) of the lower plate body 41. Specifically, in a pair of left and right regions excluding a central portion in the left-right direction on the outer surface (the lower face) of the lower plate body 41, the plurality of heat dissipating fins 42 protrude downward at intervals in the left-right direction and extend in the front-back direction. Each of the plurality of heat dissipating fins 42 achieves a function of dissipating the heat generated from the electronic component unit 10 during the operation of the electronic component unit 10 to an external space of the housing 20.

Further, the lower plate member 40 integrally includes a columnar part 43 extending downward from a surface of the outer surface (the lower face) of the lower plate body 41, and a circulating part 44 connected to the columnar part 43 and extending away from the columnar part 43 while circulating in a spiral circulation form.

Specifically, the columnar part 43 has a prismatic shape extending in the up-down direction, and extends downward from the central portion on the outer surface (the lower face) of the lower plate body 41 in the left-right direction and the front-back direction. The circulating part 44 has a belt shape extending while being bent in one plane orthogonal to the up-down direction, and circulates multiple times in a rectangular spiral circulation form when viewed in the up-down direction. An inner end portion 45 of the belt-shaped circulating part 44 in an extending direction is integrally connected to a lower end of the columnar part 43 (see FIGS. 1 and 3).

The lower plate member 40 (=the lower plate body 41+ the plurality of heat dissipating fins 42+ the columnar part 43+ the circulating part 44) is a die cast product integrally molded by casting aluminum or an aluminum alloy. For example, during the integral molding, when the lower plate member 40 is molded, the lower plate body 41 and the circulating part 44 are molded by a metal mold that is clamped in the up-down direction, and the plurality of heat dissipating fins 42 and the columnar part 43 are molded by a metal mold that is clamped in the front-back direction.

When the power supply device 1 is mounted on the vehicle, an outer end portion 46 (see FIGS. 1 to 3) of the belt-shaped circulating part 44 in the extending direction is electrically connected to a predetermined ground position of the vehicle (for example, a vehicle body of the vehicle. A so-called body earth) (see FIGS. 2 and 3). For example, a fastening hole for electric wire connection may be provided on the outer end portion 46, a ground electric wire may be connected to the outer end portion 46 by bolt fastening, and the outer end portion 46 may be directly joined to the ground position by welding or the like. Accordingly, the ground circuit of the electronic component unit 10 is electrically connected to the ground position of the vehicle via the lower plate body 41, the columnar part 43, and the circulating part 44 of the housing 20. At this time, since the circulating part 44 has a spiral shape, the circulating part 44 functions as an inductor. As a result, since the common mode noise at the high frequency described above is reduced by the circulating part 44, the power supply device 1 is less likely to propagate the common mode noise to other on-vehicle devices, and the common mode noise is less likely to be propagated from other on-vehicle devices to the power supply device 1.

Here, as the number of circulations (the number of turns) of the circulating part 44 increases, an inductance of the circulating part 44 increases, so that an effect of reducing the common mode noise at the high frequency increases. On the other hand, as the number of circulations (the number of turns) of the circulating part 44 increases, a width of the belt-shaped circulating part 44 is narrowed, so that a molding failure of the circulating part 44 during aluminum die casting is likely to occur. Accordingly, it is preferable that the number of circulations of the circulating part 44 is determined in consideration of the two viewpoints.

As described above, according to the power supply device 1 of the present embodiment, the conductive housing 20 accommodates the electronic component unit 10 and is electrically connected to the ground circuit of the electronic component unit 10 inside the housing 20. The housing 20 includes the columnar part 43 extending from the surface of the lower plate body 41 of the housing 20, and the circulating part 44 connected to the columnar part 43 and extending away from the columnar part 43 while circulating in a spiral circulation form. Therefore, when the outer end portion 46 of the circulating part 44 having such a structure is connected to the predetermined ground position (for example, the vehicle body of the vehicle. The so-called body earth), the ground circuit of the electronic component unit 10 is electrically connected to the ground position via the lower plate body 41, the columnar part 43, and the circulating part 44 of the housing 20. At this time, since the circulating part 44 has a spiral shape, the circulating part 44 operates as an inductor. As a result, the common mode noise at the high frequency is reduced by the circulating part 44. As compared to a case where an electronic component such as a noise filter is added to the electronic component unit 10, it is possible to simplify the structure of the entire power supply device 1, and to reduce manufacturing cost. Therefore, the power supply device 1 according to the present embodiment can reduce the common mode noise.

Further, the electronic component unit 10 (specifically, the switching type DC/DC converter) having the voltage conversion function of converting the input voltage to the predetermined target voltage and outputting the target voltage is provided in the power supply device 1. Accordingly, it is possible to effectively restrain the increase in the common mode noise accompanying the switching at the high frequency by the operation of the circulating part 44.

The housing 20 further includes the plurality of heat dissipating fins 42 extending from the surface of the lower plate body 41. Accordingly, the heat generated by the electronic component unit 10 when the electronic component unit 10 operates as the DC/DC converter can be dissipated to the external space of the housing 20 via the heat dissipating fins 42. By extending the columnar part 43 from the lower plate body 41 provided with the heat dissipating fins 42 and providing the circulating part 44, the space for heat dissipation can also be used as a space for reducing the common mode noise. In addition, since the columnar part 43 and the circulating part 44 also contribute to the heat dissipation, heat dissipation efficiency can be improved.

Further, the lower plate member 40 of the housing 20 (the lower plate body 41+ the plurality of heat dissipating fins 42+ the columnar part 43 and the circulating part 44) is integrally molded as a die cast product. Accordingly, as compared to a case where an outer wall of a housing in the related art that does not include the columnar part 43 and the circulating part 44, the housing of the power supply device can be manufactured without excessively increasing the manufacturing cost.

The invention is not limited to the embodiment described above, and various modifications can be adopted within the scope of the invention. For example, the invention is not limited to the embodiment described above, and modifications, improvements, and the like can be made appropriately. In addition, the material, shape, size, number, arrangement position, and the like of components in the embodiment described above are optional and are not limited as long as the invention can be achieved.

According to the embodiment described above, the circulating part 44 is provided by extending the columnar part 43 from the outer wall (the lower plate body 41) of the housing 20 where the heat dissipating fins 42 are provided. In contrast, the circulating part 44 may be provided by extending the columnar part 43 from the outer wall (the upper cover member 30) of the housing 20 where the heat dissipating fins 42 are not provided.

Further, according to the embodiment described above, the lower plate body 41, the columnar part 43, and the circulating part 44 constituting the lower plate member 40 of the housing 20 are integrally molded as a die cast product. In contrast, the lower plate member 40 of the housing 20 may be formed by joining the lower plate body 41 with the columnar part 43 and the circulating part 44, which are separate bodies from one another. In addition, the lower plate member 40 of the housing 20 may be formed by joining the lower plate body 41 and the columnar part 43 with the circulating part 44, which are separate bodies from one another.

Further, according to the embodiment described above, the electronic component unit 10 is a switching type DC/DC converter. In contrast, the electronic component unit 10 may be a unit different from the switching type DC/DC converter as long as the influence caused by the common mode noise at the high frequency is large.

Here, according to the embodiment of the power supply device 1 of the present invention described above, the power supply device (1) includes an electronic component unit (10), and a conductive housing (20) for accommodating the electronic component unit (10). The housing (20) includes a columnar part (43) extending from a surface of an outer wall (41) of the housing (20), and a circulating part (44) connected to the columnar part (43) and extending away from the columnar part (43) while circulating in a spiral circulation form. The housing (20) is electrically connected to a ground circuit of the electronic component unit (10) inside the housing (20).

According to the power supply device having the configuration described above, the conductive housing accommodates the electronic component unit and is electrically connected to the ground circuit of the electronic component unit inside the housing. The housing includes the columnar part extending from the surface of the outer wall of the lower plate body of the housing, and the circulating part connected to the columnar part and extending away from the columnar part while circulating in a spiral circulation form. Therefore, when an outer end of the circulating part having such a structure is connected to the predetermined ground position (for example, the vehicle body of the vehicle. The so-called body earth), the ground circuit of the electronic component unit is electrically connected to the ground position via the outer wall, the columnar part, and the circulating part of the housing. At this time, since the circulating part has a spiral shape, the circulating part operates as an inductor, and the common mode noise at the high frequency is reduced by the circulating part. As compared to the case where an electronic component such as a noise filter is added to the electronic component unit, it is possible to simplify the structure of the entire power supply device, and to reduce the manufacturing cost. Therefore, the power supply device having the present configuration can reduce the common mode noise.

Further, the electronic component unit (10) may have a voltage conversion function of converting an input voltage to a predetermined target voltage and outputting the target voltage.

According to the power supply device having the configuration described above, the electronic component unit (specifically, the DC/DC converter described above) having the voltage conversion function of converting an input voltage to a predetermined target voltage and outputting the target voltage is provided in the power supply device. Accordingly, it is possible to effectively restrain the increase in the common mode noise accompanying the switching at the high frequency by the operation of the circulating part.

Further, the housing (20) may include a plurality of heat dissipating fins (42) extending from the surface of the outer wall (41).

According to the power supply device having the configuration as described above, the housing includes the plurality of heat dissipating fins extending from the surface of the outer wall. Accordingly, the heat generated by the electronic component unit when the electronic component unit operates as the DC/DC converter can be dissipated to the external space of the housing via the heat dissipating fins. By extending the columnar part from the outer wall provided with the heat dissipating fins and providing the circulating part, the space for heat dissipation can also be used as a space for reducing the common mode noise. In addition, since the columnar part and the circulating part also contribute to the heat dissipation, heat dissipation efficiency can be improved.

Further, the power supply device (1) may be a die cast product in which the outer wall (41), the columnar part (43), and the circulating part (44) of the housing (20) are integrally molded.

According to the power supply device having the configuration as described above, the outer wall, the columnar part, and the circulating part of the housing are integrally molded as a die cast product. Accordingly, as compared to the case where the outer wall in the related art that does not include the columnar part and the circulating part is molded, the housing of the power supply device can be manufactured without excessively increasing the manufacturing cost.

The present application is based on Japanese Patent Application No. 2021-185738 filed on Nov. 15, 2021, and the contents are incorporated herein by reference.

INDUSTRIAL APPLICABILITY

The power supply device according to the invention can reduce the common mode noise. The invention having this effect can be used, for example, as a DC/DC converter used for, for example, electric power conversion between a battery mounted on a vehicle such as a hybrid vehicle and an inverter.

REFERENCE SIGNS LIST 1 power supply device
10 electronic component unit
20 housing
41 lower plate body (outer wall)
42 heat dissipating fin
43 columnar part
44 circulating part

What is claimed is:
1. A power supply device comprising:
an electronic component unit; and
a conductive housing for accommodating the electronic component unit inside of the conductive housing, wherein
the housing includes a columnar part extending from an outer surface of an outer wall of the housing, and a circulating part connected to the columnar part and extending away from the columnar part while circulating in a spiral circulation form,
the housing is electrically connected to a ground circuit of the electronic component unit inside the housing, and
the columnar part is outside of the housing, wherein
the power supply device is a die cast product in which the outer wall, the columnar part, and the circulating part of the housing are integrally molded.
2. The power supply device according to claim 1, wherein the electronic component unit has a voltage conversion function of converting an input voltage to a predetermined target voltage and outputting the target voltage.
3. The power supply device according to claim 2, wherein the housing includes a plurality of heat dissipating fins extending from the surface of the outer wall.
4. The power supply device according to claim 1, wherein the circulating part spaced away from the housing, and the columnar part extends from the outer surface of the housing to the circulating part.
5. The power supply device according to claim 4, wherein the circulating part has a belt shape extending while being bent in a plane and the spiral circulation form is a spiral rectangle.

* * * * *